(12) United States Patent
Padaparambil

(10) Patent No.: US 7,161,846 B2
(45) Date of Patent: Jan. 9, 2007

(54) DUAL-EDGE TRIGGERED MULTIPLEXER FLIP-FLOP AND METHOD

(75) Inventor: Muralikumar A. Padaparambil, Poughkeepsie, NY (US)

(73) Assignee: Seiko Epson Corporation, Tokyo (JP)

(*) Notice: Subject to any disclaimer, the term of this patent is extended or adjusted under 35 U.S.C. 154(b) by 95 days.

(21) Appl. No.: 10/990,119

(22) Filed: Nov. 16, 2004

(65) Prior Publication Data

US 2006/0104124 A1 May 18, 2006

(51) Int. Cl.
*G11C 7/10* (2006.01)

(52) U.S. Cl. ............... 365/189.05; 365/230.08; 365/230.02

(58) Field of Classification Search ........... 365/189.05, 365/189.02, 233, 220, 221, 230.02, 230.08, 365/154
See application file for complete search history.

(56) References Cited

U.S. PATENT DOCUMENTS

| | | | |
|---|---|---|---|
| 4,829,471 A | 5/1989 | Banerjee et al. | |
| 5,497,355 A * | 3/1996 | Mills et al. | 365/230.08 |
| 5,572,721 A | 11/1996 | Rostamian | |
| 5,689,731 A | 11/1997 | West et al. | |
| 5,798,720 A | 8/1998 | Yano | |
| 5,838,630 A * | 11/1998 | Okajima | 365/233 |
| 5,844,844 A | 12/1998 | Bauer et al. | |
| 5,982,309 A | 11/1999 | Xi et al. | |
| 6,301,322 B1 | 10/2001 | Manning | |
| 6,335,696 B1 | 1/2002 | Aoyagi et al. | |
| 6,348,825 B1 | 2/2002 | Galbi et al. | |
| 6,437,623 B1 * | 8/2002 | Hsu et al. | 327/202 |
| 6,608,513 B1 | 8/2003 | Tschanz et al. | |
| 2004/0218460 A1 * | 11/2004 | Lee | 365/233 |

* cited by examiner

*Primary Examiner*—Van Thu Nguyen
*Assistant Examiner*—Dang Nguyen

(57) ABSTRACT

A dual edge multiplexing flip-flop comprises a first circuit block having a first data input, a first clock signal input, a supply voltage input, and a ground connection; a second circuit block having a second data input, a second clock signal input, a supply voltage input, and a ground connection. Each circuit block is coupled to a common output node. When a common clock signal is input into the clock signal inputs, each circuit block outputs a floating voltage during one half of each clock cycle and a voltage indicative of a corresponding data input signal during the other half of each clock cycle.

17 Claims, 4 Drawing Sheets

DUAL-EDGE TRIGGERED MULTIPLEXER FLIP-FLOP AND METHOD

CROSS-REFERENCE TO RELATED APPLICATION

This application is related to commonly-assigned U.S. patent application Ser. No. 1,0990,120, filed concurrently herewith in the name of the inventor of this application, and entitled entitled, "Low-Power Serializer With Half-Rate Clocking And Method." This related application is incorporated by reference herein in its entirety.

BACKGROUND OF THE INVENTION

1. Field of the Invention

The present invention relates generally to an electronic circuit for serializing data from an incoming parallel data stream.

2. Description of the Related Art

High speed flip-flops and multiplexers are used in a variety of applications, and at high frequencies, can draw significant amounts of power. Such circuitry is used in a serializer, which is a key component in serial digital communication applications. In such systems, serializers are used to convert multi-bit low speed parallel data into high-speed serial data. For high-frequency applications, completely full-swing CMOS serializers are not considered due to their high power consumption. To reduce power, the high-speed blocks are designed using a differential logic family such as Current Mode Logic, but if the whole serializer is designed using a differential logic family, power consumption is still high. Hence, a hybrid combination of full-swing logic (at low frequency) and differential logic (at high frequency) is preferred. The usage of two entirely different logic families, however, poses a significant signal reliability problem at the interface between the two logic families. To alleviate this problem, careful designing is required, which requires more design resources and time. Also, differential circuits have additional overhead of current-source reference circuits to provide reference for the tail current in the differential logic.

FIG. 1 shows an exemplary serializer which receives input signals 120, 122, 124, and 126. Each input bit exhibits either a high or low voltage indicative of either a high or low bit value. The input data is received in parallel at a frequency of 625 MHz. The serializer of FIG. 1 includes three instances of circuit blocks 130 (shown as 130A, 130B, and 130C), each having two flip-flops 132 and a multiplexer 134 to generate a single output signal containing data of both input signals at twice the input frequency. In a first frequency domain of f/4, e.g., 625 MHz, input signals 120 and 122 are multiplexed to output signal 140 by circuit block 130A, and input signals 124 and 126 are multiplexed to output signal 144 by circuit block 130B. Output signals 140, 144 are taken as input signals to circuit block 130C in the f/2 domain having a frequency of f/2, e.g., 1.25 GHz. Output signal 150 of circuit block 130C is passed through a flip-flop 152, which is in the frequency domain of f, e.g., 2.5 GHz and provides an output signal 154 of serialized data having a frequency 4 times that of input signals 120, 122, 124, 126.

This approach to serializing data has significant disadvantages. First, this design contains three levels of flip-flop logic, which operate at frequencies of f/4, f/2, and f as described above. Four operate at f/4 frequency, two operate at f/2 frequency, and one flip-flop operates at f frequency. The total switching power due to clocks is given by:

$$\text{Total Clock Switching Power} = 4^*(CV^2 f/4) + 2^*(CV^2 f/2) + 1^*(CV^2 f)$$
$$= 3CV^2 f$$

where C is the input capacitance for the clock line of a flip-flop, f is the frequency of the clock on the output flip-flop 152, and V is power supply voltage. Note that this equation is an approximate equation since the power consumed by the multiplexer is not incorporated. In general for a $2^N:1$ serializer, total clock switching power $=(N+1)CV^2 f$.

The primary concern in using a full-swing serializer for high-speed applications is power. Any improvement in the serializing technique, which addresses power, would greatly improve the design cycle time and total system power.

SUMMARY OF THE INVENTION

Broadly speaking, the present invention fills this need by providing a dual-edge triggered multiplexer flip-flop for multiplexing multiple data streams. An exemplary circuit performs multiplexing at high speeds with very low power drawn. It should be appreciated that the present invention can be implemented in numerous ways, including as a process, an apparatus, a system, a device, or a method.

In one embodiment, the invention involves a serializer that comprises a first input for receiving a first data signal at a first frequency, a second input for receiving a second data signal at the first frequency, and a clock input for receiving a clock signal having the first frequency. The serializer also includes a plurality of transistors propagating the first data signal and the second data signal to an output node, wherein each of the first and second data signals is applied to a respective master latch, each master latch having a respective node in communication with a respective slave latch, the slave latches cooperating as a multiplexer to pass the first data signal from one of the master latch nodes to the output node when the clock signal is high and to pass the second data signal from the other of the master latch nodes to the output node when the clock signal is low, thereby generating an output data stream having a second frequency that is greater than the first frequency.

In another embodiment, a dual edge multiplexing flip-flop comprises a first circuit block having a first data input for receiving a first data signal and a clock signal input for receiving a clock signal, and a second circuit block having a second data input for receiving a second data signal and a clock signal input for receiving the clock signal. The first and second circuit blocks have a common node at which they alternate within a clock cycle in providing signals indicative of the first and second data signals, respectively. During the half of the clock cycle that a particular circuit block is not providing a data signal, provides a floating signal at the common node.

In a further embodiment, a combined two-way multiplexer and flip-flop comprises first and second data inputs and a clock signal input. The circuit also includes a first node where a first bit indicative of a signal input at the first data input is latched, and a second node where a second bit indicative of a signal input at the second data input is latched. A third node of the circuit is pinned to a first voltage when a clock signal is low, and carries a signal indicative of the first bit when the clock signal switches to high. A fourth node of the circuit is pinned to a second voltage when the clock signal is high, and carries a signal indicative of the second bit when the clock signal switches to low. A fifth node carries a signal indicative of the first bit when the clock signal is high and indicative of the second bit when the clock signal is low.

In a still further embodiment, an integrated circuit formed on a chip is provided. The circuit comprises means for receiving first and second data signals and a clock signal at a first frequency. The circuit further comprises a plurality of transistors propagating the first data signal and the second data signal to an output node, wherein each of the first and second data signals is applied to a respective master latch, each master latch having a respective node in communication with a respective slave latch, the slave latches cooperating as a multiplexer to pass the first data signal from one of the master latch nodes to the output node when the clock signal is high and to pass the second data signal from the other of the master latch nodes to the output node when the clock signal is low, thereby generating an output data stream having a second frequency that is approximately twice that of the first frequency.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

The term, "serializer" is intended to mean a device that receives parallel data from separate data streams and combines them together into a single serial data signal without any data loss. A "serializer" specifically performs this function by converting incoming parallel bits of data to a single data stream wherein the bits are provided in series.

Figure 2:
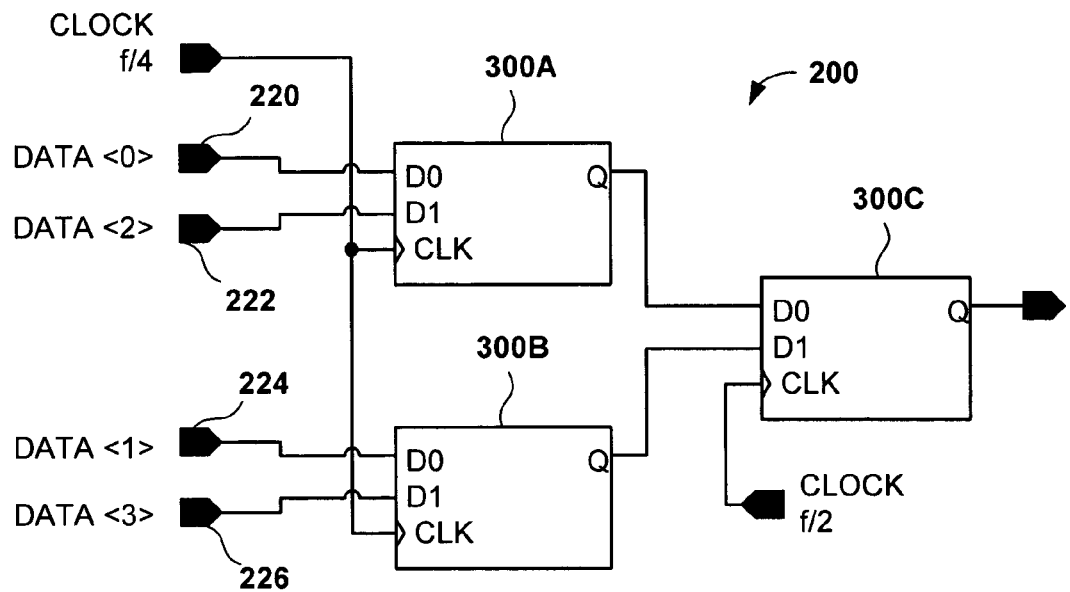
FIG. 2 shows an exemplary 4-to-1 serializer utilizing three dual edge triggered multiplexer flip-flops, in accordance with embodiments of the invention.

An exemplary application for a dual-edge triggered multiplexer flip-flop is shown in FIG. 2. Specifically, FIG. 2 shows an exemplary 4-to-1 serializer 200 providing an output signal Q containing data from input signals 220, 222, 224, and 226 at a frequency f. Serializer 200 is an exemplary circuit having two frequency domains f/4 and f/2, providing an output data signal at frequency of f. A circuit 300 is instantiated three times in the 4-to-1 serializer 200 at 300A, 300B, and 300C. Circuits 300A and 300B function in a frequency domain of f/4 and accept data from input signals 220, 222, 224, and 126, and a clock signal coupled to these inputs at a frequency of f/4. Circuit 300C functions in the f/2 domain and accepts data signals and a clock signal at a frequency of f/2, providing an output serialized data signal having a frequency of f.

Each circuit 300 is a dual-edge triggered multiplexer flip-flop. Although presented in the context of 4-to-1 serializer 200, it should be noted that other applications for circuit 300 will occur to those skilled in the art. Input signals 220, 222 are input into circuit 300A at a frequency f/4, which provides an output signal at frequency f/2. Likewise, input signals 224, 226 are input into circuit 300B. Output signals of circuits 300A, 300B are input into circuit 300C at a frequency f/2, providing output signal Q at a frequency of f, with data output at the rising edge and falling edge of the clock signal, which is input into circuit 300C at a frequency of f/2. No additional flip-flop at frequency f at the output is necessary as was the case with the conventional circuit shown in FIG. 1. As would occur to the person having ordinary skill in the art, the circuits 300 shown in FIG. 2 could be combined to form a serializer having any of $2^N$ inputs.

Figure 1:
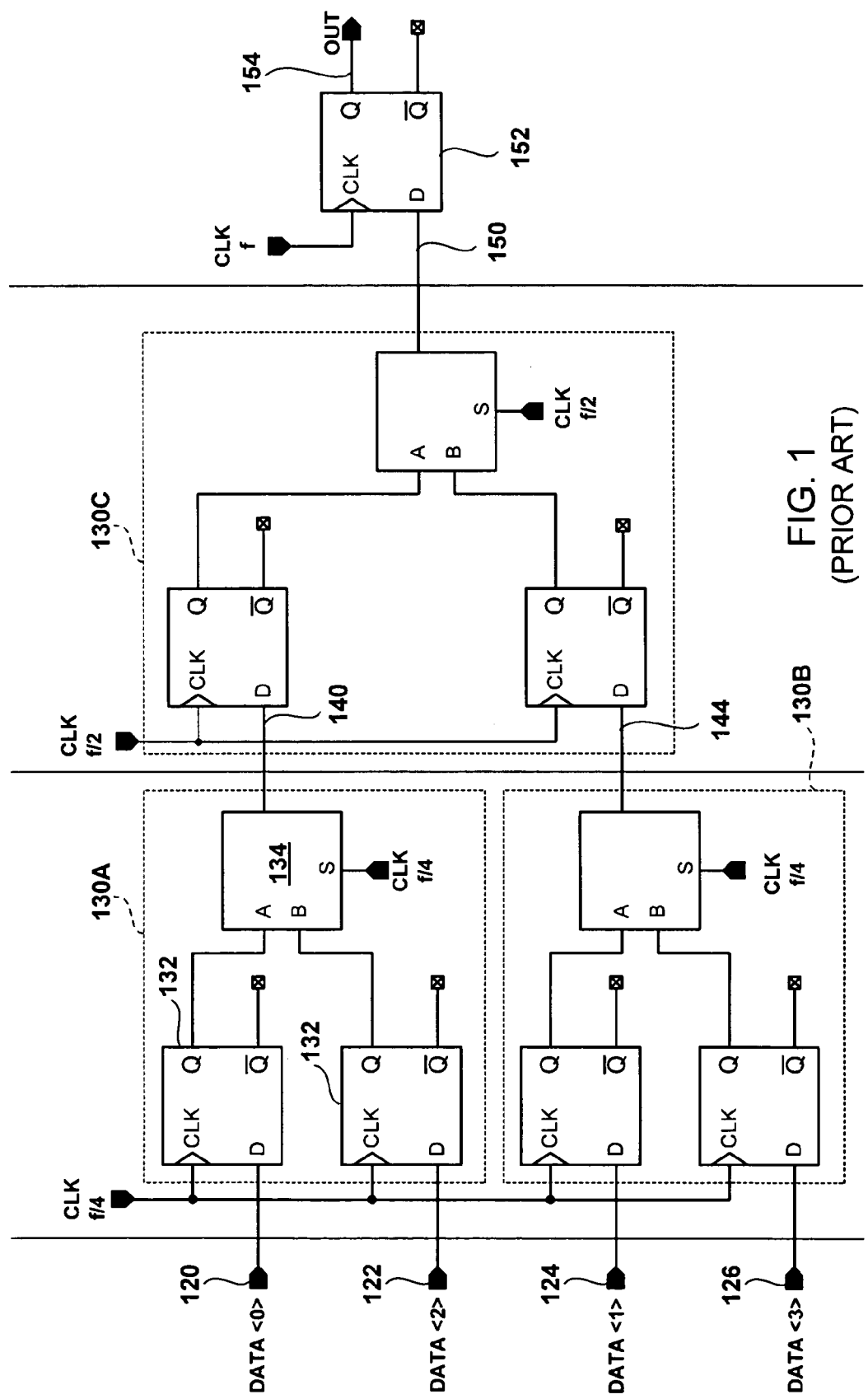
FIG. 1 shows a conventional 4-to-1 serializer.

Advantageously, the power requirement for serializer 200 is much less than that for the prior art circuit shown in FIG. 1. Since serializer 200 uses only two clock domains (f/2 and f/4) to provide the same throughput as the serializer shown previously in FIG. 1, the total switching power is:

$$\text{Total clock switching power} = 2^*(C_1 V^2 f/4) + 1^*(C_1 V^2 f/2)$$
$$= 2^*(C_1 V^2 f/2)$$

where $C_1$ is capacitance on the clock line of the dual edge triggered flip-flop. Remembering that C is the capacitance on the clock line for the prior art circuit, it should be noted that $C_1 << 2^*C$. $C_1$ is not equal $2^*C$ since the new design is compact and the clock lines are shorter. In general, for a $2^N:1$ serializer using circuit 300, total clock switching power is $N^*(C_1 V^2 f/2)$. Compared to a conventional serializer, the serializer of this invention consumes very low power especially for larger numbers of inputs N.

Figure 3:
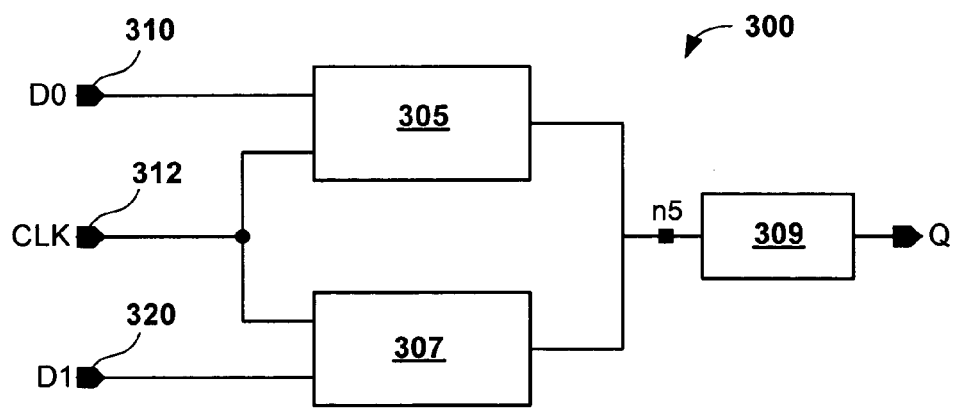
FIG. 3 shows one dual edge triggered multiplexer flip-flop of FIG. 2 in simplified form having three component circuit blocks.

FIG. 3 shows circuit 300 in simplified form having three main circuit blocks. Circuit block 305 receives a first data signal (D0) 310 and a clock signal 312. When the clock signal goes from low to high, a latched input value is passed, inverted, to output node n5. When the clock is low, the output signal of circuit block 305 floats, and circuit block 309 takes the output signal of circuit block 307. Circuit block 307 inputs a second data signal (D1) 320 and the clock signal 312. When the clock signal goes from high to low, a latched input value is passed, inverted, to output node n5. When the clock is high, the output signal of circuit block 307 floats, and circuit block 309 takes the output signal of circuit block 305. By "float" it is meant that there is no path through the circuit block to either ground or supply voltage Vdd. By "inverted" it is meant that the voltage is converted from high to low or from low to high. Although the signal at n5 is inverted from the corresponding data input signal, it is still indicative of that input signal and need only be inverted again to properly follow the input data. In one embodiment, circuit block 309 is a simple inverter, and will therefore invert the signal at n5 to generate Q.

By capturing data on both edges of the clock signal, exemplary circuit 300 provides a dual-edge triggered integrated multiplexer flip-flop that generates serialized data flow at twice the clock frequency applied to the output stage 309. That is, the output data rate is twice that of the input data rate but clocked with half the frequency that is required in a single-edge triggered flip-flop. This reduction in frequency reduces power in comparison with a standard single-edge triggered flip-flop for an identical throughput.

Figure 4:
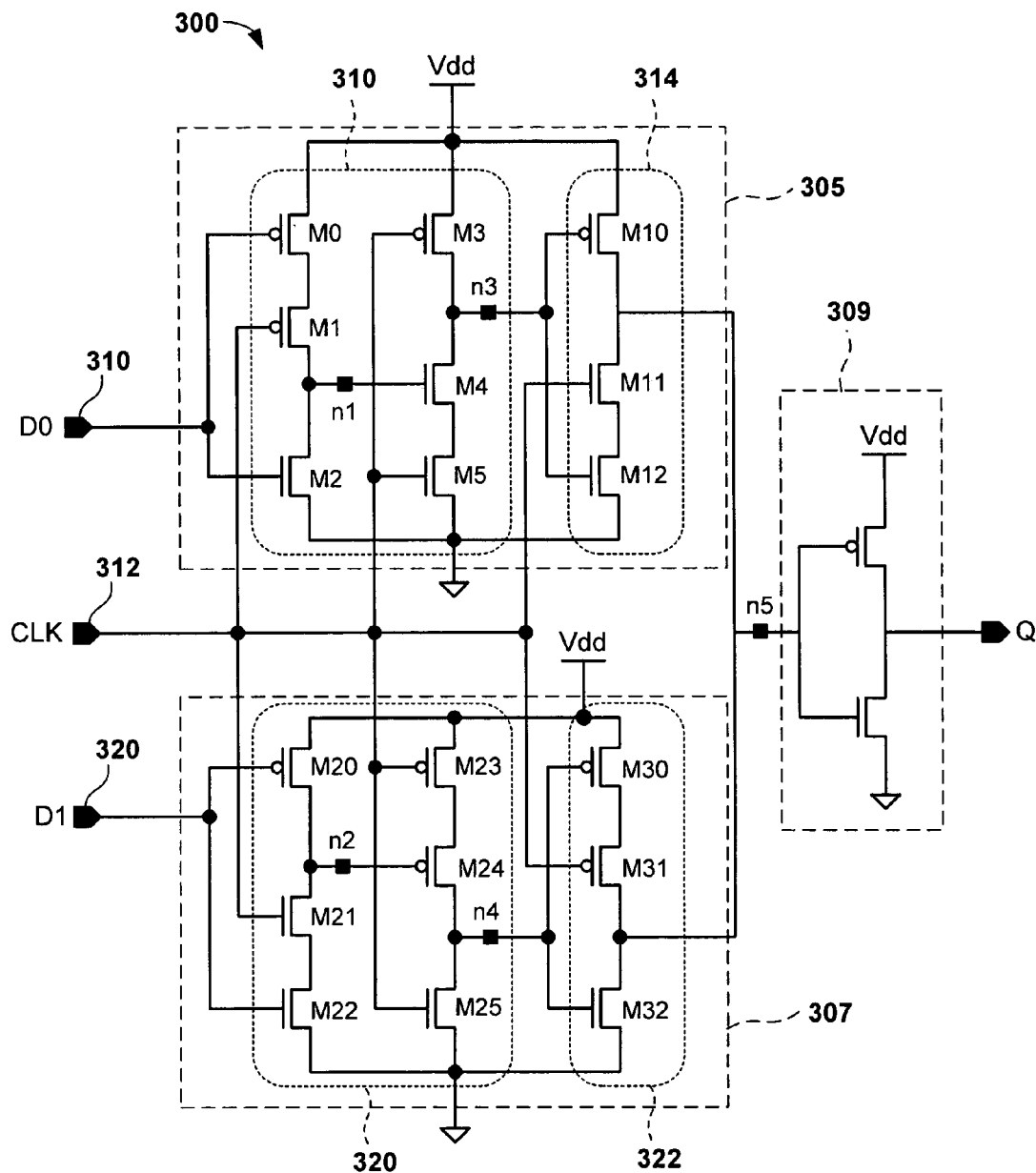
FIG. 4 shows one dual edge triggered multiplexer flip-flop of FIG. 2 in detail.

FIG. 4 shows a detailed look at the exemplary serializing circuit 300. Again, this is a circuit that takes two data input signals D0, D1 and a clock signal CLK at frequency f/2 and outputs data at frequency f. Upper circuit block 305 operates on D0 and lower circuit block 307 operates on D1. D0 is output when CLK is high and D1 is output when CLK is low.

Upper circuit block 305 and lower circuit block 307 each have a master latch 310, 320, and a slave latch 314, 322, respectively. The master latches are separate, and they hold respective data bits stable when the slave samples the data. The two slave latches act in a complementary fashion enabling them to be tied together to form a multiplexer. The circuits of blocks 305 and 307, as well as that of inverter block 309 are preferably CMOS type logic circuits.

Master latch 310 is formed from transistors M0–M5. When CLK is low, M1 is on. When M1 is on, M0 and M2 invert D0 such that the signal at n1 is high when D0 is low and n1 is low when D0 is high. Continuing with CLK being low, M3 is on and M5 is off. Therefore the signal at n3 is pinned to high. With the n3 signal being high, M10 is off. M11 is also off because CLK is still low. This isolates n5 from D0, Vdd, and ground, allowing the n5 signal to float when CLK is low.

When CLK is high, M1 and M3 are off and M5 is on. Thus, when the n1 signal is low, M4 is off and the n3 signal does not discharge. When the n1 signal is high, M4 is on. With CLK being high and the n1 signal being high, the n3 signal is allowed to discharge through M4 and M5. Thus, at the instant of CLK going from low to high, M10 either turns on or remains off (based on whether the signal at n3 discharges or not) and M11 turns on thereby connecting n5 to either supply voltage Vdd via M10 or ground via M11 and M12, depending on the n3 signal.

Note that master latch 310 drives slave latch 314, and that circuit block 305 outputs the inverse of D0 at n5 when CLK is high, and floats the signal at n5 when CLK is low.

Referring now to circuit block 307, when CLK is high, M21 is on and therefore the inverse of D1 appears on n2, M20, M22 acting as an inverter. When the n2 signal is high, M24 is off and when the n2 signal is low M24 is on. When CLK is high, M25 is on, thereby pinning n4 to ground. The n4 signal controls transistors M30 and M32 such that, when n4 is grounded, M30 is on and M32 is off. While CLK is high, M31 is off. Since both M31 and M32 are off and n5 is connected between these two transistors, the signal at n5 is allowed to float while CLK is high.

When CLK is low, M21 and M25 are off. Thus, when the n2 signal is high, M24 is off; therefore n4 cannot be charged to Vdd since current cannot flow from Vdd though M24 to n2. When the signal at n2 is low, M24 is on and n4 communicates with Vdd via M23 and M24 thereby charging n4 to Vdd. Thus, at the instant of CLK going from high to low, if the n2 signal is low, n4 is allowed to charge thereby turning M32 on and connecting n5 to ground. If, at the instant CLK goes from high to low, the signal at n2 is high, n4 is not permitted to charge, M31 turns on, and n5 is connected to Vdd.

Note that master latch 320 latches D1 and provides a stable input to the slave latch 322 when CLK is low.

Thus n5 is connected to either Vdd or ground via circuit block 305 when CLK is high and either Vdd or ground via circuit block 307 when CLK is low. The signal at n5 is inverted D0 when CLK is high and inverted D1 when CLK is low. Note also that the n5 signal propagates through inverter circuit block 309 so that output Q follows inputs D0 and D1 but at twice the frequency.

The circuitry of FIGS. 2–4 can be implemented in any number electronic devices, and can be embodied in a number of forms. For instance, the circuitry can be fabricated onto a single chip and then interfaced with other chips, components or systems. In another implementation, the circuitry can be integrated into a custom chip that has one or more other functions or cores. Once the circuit is integrated into a target application, the circuit is packaged to complete the integration. The packaged circuit can then be interfaced with other components. Still further, one embodiment may include having the chip integrated on a silicon chip having multiple fabricated levels, or alternatively formed (partially or wholly) on a printed circuit board using discrete and non-discrete devices and metal traces. Accordingly, it should be understood that the circuitry of FIGS. 2–4 can take on any number of physical forms and can be integrated individually or as part of a system.

Figure 5:
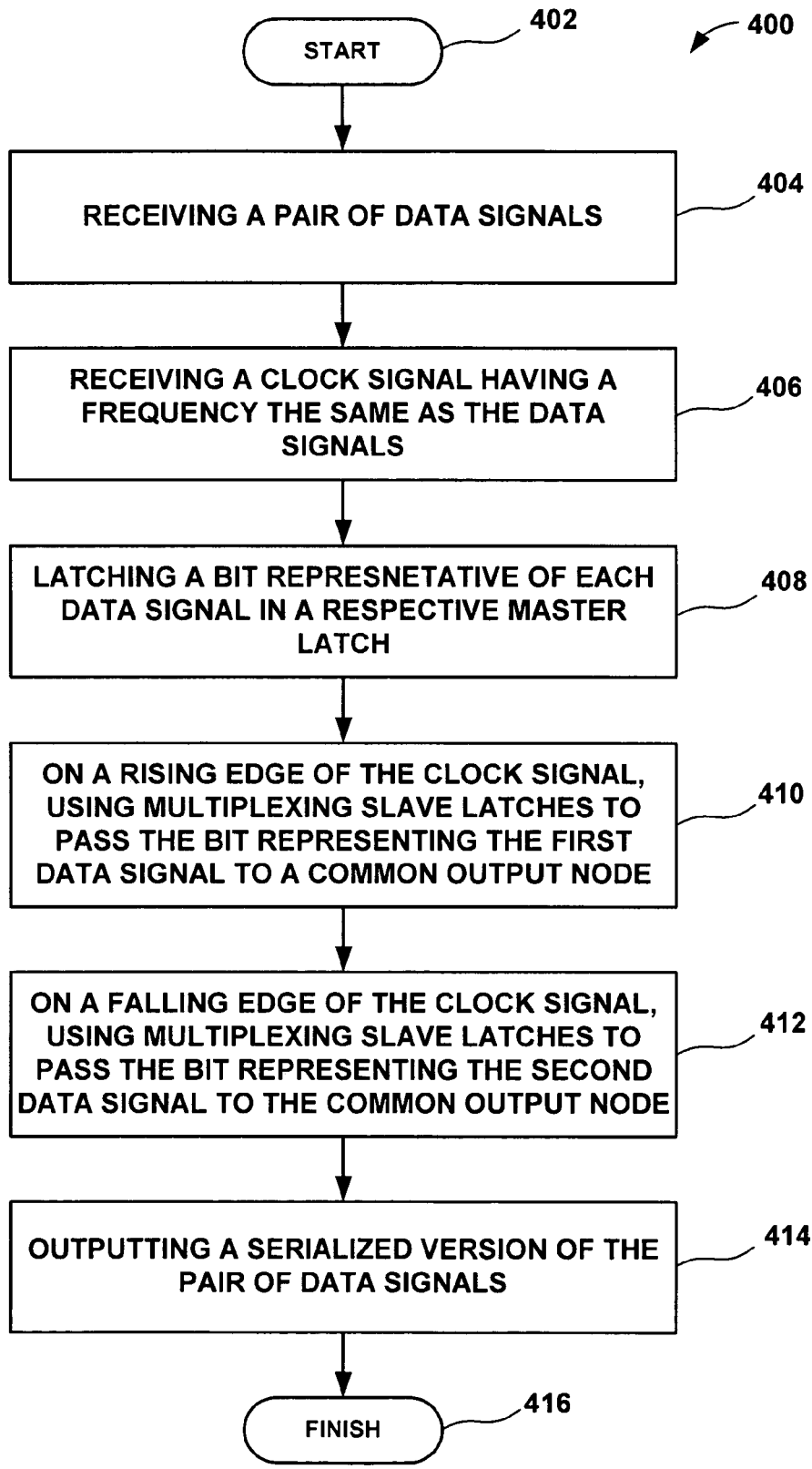
FIG. 5 shows a flowchart depicting an exemplary procedure performed by the multiplexer flip-flop of FIGS. 3 and 4.

FIG. 5 shows a flowchart 400 depicting an exemplary procedure for serializing a pair of inputs. The procedure begins as indicated at starting block 402 and flows to operation 404 wherein a pair of data signals of a parallel data path are received. This is shown in FIG. 4 by data signals 310 (D0) and 320 (D1) received by circuit 300. The procedure then flows to operation 408 wherein a bit representative of each data signal is latched in a respective master latch. This is shown in FIG. 4 by master latches 310 and 320 latching respective bits at nodes n1 and n2. The procedure then flows to operation 410 wherein, on a rising edge of the clock signal, the bit representing the first data signal is passed to a common output node by multiplexing slave latches. As shown in FIG. 4, multiplexing slave latches comprise slave latches 314 and 322. When clock signal 312 goes from low to high, the bit stored at node n1 is sampled and passed to output node n5 as described above. Returning to FIG. 5, in operation 412, the multiplexing slave latches pass the bit representing the second data signal to the common output node at the falling edge of the clock signal. This occurs as described above with reference to FIG. 4. In operation 414, a serialized version of the pair of data signals is output as Q (FIG. 4), downstream of inverter 309. The operation is then completed as indicated by finish block 416. This operation is performed for each clock cycle. Note a clock signal having a frequency that is the same as the output signal frequency is not required since data is output at both the rising edge and falling edge of the clock signal.

Although the foregoing invention has been described in some detail for purposes of clarity of understanding, it will be apparent that certain changes and modifications may be practiced within the scope of the appended claims. For example, the circuit presented in FIGS. 3 and 4 has many potential applications as would occur to those of skill in the art, beyond its implementation in the exemplary serializer circuit presented in FIG. 2. Accordingly, the present embodiments are to be considered as illustrative and not restrictive, and the invention is not to be limited to the details given herein, but may be modified within the scope and equivalents of the appended claims.

What is claimed is:
1. A serializer, comprising:
  a first input for receiving a first data signal at a first frequency;
  a second input for receiving a second data signal at the first frequency;

a clock input for receiving a clock signal having the first frequency; and a plurality of transistors propagating the first data signal and the second data signal to an output node, wherein each of the first and second data signals is applied to a respective master latch, each master latch having a respective node in communication with a respective slave latch, the slave latches cooperating as a multiplexer to pass the first data signal from one of the master latch nodes to the output node when the clock signal is high and to pass the second data signal from the other of the master latch nodes to the output node when the clock signal is low, thereby generating an output data stream having a second frequency that is greater than the first frequency.

2. The serializer of claim 1, wherein a first group of the plurality of transistors are embodied in a first circuit block and a second group of the plurality of transistors are embodied in a second circuit block, each circuit block including one of the two master latches and one of the two slave latches, each circuit block having no more than 9 transistors.

3. The serializer of claim 2, wherein each of the first and second circuit blocks is in communication with the output node, each circuit block providing a floating signal value at the output node during one half of the clock signal cycle.

4. The serializer of claim 1, wherein the plurality of transistors are formed on an integrated circuit chip.

5. A dual edge multiplexing flip-flop, comprising:

a first circuit block having a first data input for receiving a first data signal and a clock signal input for receiving a clock signal; and a second circuit block having a second data input for receiving a second data signal and a clock signal input for receiving the clock signal;

the first and second circuit blocks having a common node, wherein, during one half of each cycle of the clock signal, the first circuit block provides a signal indicative of the first data signal at the common node and the second circuit block provides a floating signal at the common node, and during another half of each cycle of the clock signal, the second circuit block provides a signal indicative of the second data signal at the common node and the first circuit block provides a floating signal at the common node.

6. The dual edge multiplexing flip-flop of claim 5, wherein the first circuit block isolates the common node from a voltage supply and a ground when the clock signal is low and outputs a signal indicative of the first data signal when the clock signal is high, and the second circuit block isolates the common node from the voltage supply and the ground when the clock signal is high and outputs a signal indicative of the second data signal when the clock signal is low.

7. The dual edge multiplexing flip-flop of claim 6, wherein the signal indicative of the first data signal is an inverted version of thereof and the signal indicative of the second data signal is an inverted version thereof, the dual edge multiplexing flip-flop further comprising an inverter having an input coupled to the common node, the inverter outputting a non-inverted signal indicative of the first data signal or the second data signal, depending upon a state of the clock signal.

8. The dual edge multiplexing flip-flop of claim 5, wherein each of the first and second circuit blocks comprise a master latch, a slave latch, and a node connection the corresponding master and slave latches, wherein the master latches hold respective connection node signals stable while the slave latches samples the respective connection node signals.

9. The dual edge multiplexing flip-flop of claim 8, wherein the slave latch of the first circuit block and the slave latch of the second circuit block cooperate to form a multiplexer.

10. A combined two-way multiplexer and flip-flop circuit, comprising:

a first data input;

a second data input;

a clock signal input;

a first node where a first bit indicative of a signal input at the first data input is latched;

a second node where a second bit indicative of a signal input at the second data input is latched;

a third node pinned to a first voltage when a clock signal is low, the third node carrying a signal indicative of the first bit when the clock signal switches to high;

a fourth node pinned to a second voltage when the clock signal is high, the fourth node carrying a signal indicative of the second bit when the clock signal switches to low; and a fifth node carrying a signal indicative of the first bit when the clock signal is high and indicative of the second bit when the clock signal is low.

11. The combined two-way multiplexer and flip-flop circuit of claim 10, further comprising a first circuit block that includes the first data input, the first node, and the third node, and a second circuit block that includes the second data input, the second node, and the fourth node, the first circuit block connecting the fifth node to one of a supply voltage and ground when the clock signal is high and providing a floating signal at the fifth node when the clock signal is low, the second circuit block connecting the fifth node to one of the supply voltage and the ground when the clock signal is low and providing a floating signal at the fifth node when the clock signal is high.

12. The combined two-way multiplexer and flip-flop circuit of claim 11, wherein the first and second circuit blocks comprise a plurality of transistors that are formed into an integrated circuit chip.

13. An integrated circuit formed on a chip, the integrated circuit comprising:

means for receiving a first data signal at a first frequency;

means for receiving a second data signal at the first frequency;

means for receiving a clock signal having the first frequency; and a plurality of transistors propagating the first data signal and the second data signal to an output node, wherein each of the first and second data signals is applied to a respective master latch, each master latch having a respective node in communication with a respective slave latch, the slave latches cooperating as a multiplexer to pass the first data signal from its master latch node to the output node when the clock signal is high and to pass the second data signal from its master latch mode to the output node when the clock signal is low, thereby generating an output data stream having a second frequency that is approximately twice that of the first frequency.

14. The integrated circuit of claim 13, wherein the plurality of transistors are embodied in first and second circuit blocks, each of which includes one of the two master latches and one of the two slave latches, each of the circuit blocks having no more than 9 transistors.

15. The integrated of claim 14, wherein each circuit block provides a floating signal at the output node during one half of the clock signal cycle.

16. A method for combining a first data signal and a second data signal to generate a serialized output data signal, the method comprising:

receiving the first and second data signals;

receiving a clock signal having a frequency that is the same as the frequency of the first and second data signals;

latching a first bit value of the first data signal and latching a second bit value of the second data signal;

on a rising edge of the clock signal, using slave latches to pass the inverted first bit value to a common output node; and on a falling edge of the clock signal, using slave latches to pass the inverted second bit value to the common output node.

17. The method of claim 16, further comprising:

inverting the signal at the common output node to generate a serialized version of the first data signal and said second data signal.

\* \* \* \* \*